United States Patent
Chiang et al.

(10) Patent No.: US 7,179,715 B2
(45) Date of Patent: Feb. 20, 2007

(54) METHOD FOR CONTROLLING SPACER OXIDE LOSS

(75) Inventors: Ju-Chien Chiang, Tainan (TW); Shu-Huei Sun, Hsinchu (TW); Li-Te S. Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 85 days.

(21) Appl. No.: 11/085,217

(22) Filed: Mar. 22, 2005

(65) Prior Publication Data

US 2006/0216918 A1    Sep. 28, 2006

(51) Int. Cl.
*H01L 21/336* (2006.01)
(52) U.S. Cl. .............. 438/303; 438/595; 438/230; 438/197
(58) Field of Classification Search .......... 438/230, 438/303, 305, 595, 585, 197
See application file for complete search history.

(56) References Cited

U.S. PATENT DOCUMENTS

| | | | |
|---|---|---|---|
| 5,783,475 A | * | 7/1998 | Ramaswami ............ 438/303 |
| 5,920,783 A | * | 7/1999 | Tseng et al. ............ 438/305 |
| 6,265,274 B1 | * | 7/2001 | Huang et al. ........... 438/305 |
| 6,764,911 B2 | * | 7/2004 | Hsu et al. ............... 438/303 |
| 6,777,283 B2 | * | 8/2004 | Maeda ................... 438/231 |

* cited by examiner

*Primary Examiner*—Michael Trinh
(74) *Attorney, Agent, or Firm*—Birch, Stewart, Kolasch & Birch, LLP (57) ABSTRACT

The formation of gate spacers on the sides of a gate structure on a semiconductor substrate is provided. In one embodiment, a gate structure is formed on a gate insulator layer of the semiconductor substrate. A liner layer is formed over the exposed surfaces of the substrate, the gate insulator layer, and the gate structure. A layer of gate spacer material is formed over the liner layer. Thereafter, gate spacers are formed from the layer of gate spacer material. A protection layer is formed over portions of the liner layer, gate structure, and the gate spacers. The protection layer is etched back. A first wet etch procedure is performed to remove exposed portions of the liner layer. The protection layer is removed and a second wet etch procedure is performed to remove substantially a top portion and a bottom portion of the liner layer.

20 Claims, 6 Drawing Sheets

METHOD FOR CONTROLLING SPACER OXIDE LOSS

BACKGROUND

The present invention relates generally to the fabrication of spacers on the sides of a gate structure of a semiconductor device, and more particularly, to methods for controlling spacer oxide loss.

The advent of micro-miniaturization, or the ability to fabricate semiconductor devices with sub-micron features, has resulted in improved device performance as well as decreases in processing costs. Smaller device features allow reductions in performance degrading parasitic junction capacitances to be realized. In addition, a greater number of smaller semiconductor chips comprised with sub-micron features, but still exhibiting device densities equal to, or greater than, counterpart semiconductor chips fabricated with larger features, can be obtained from a specific size substrate thus reducing the processing cost for an individual semiconductor chip. However, the trend to micro-miniaturization can place stringent demands on specific semiconductor elements. For example, for sub-0.13 um technology, gate spacers formed on the sides of a gate structure can be less than 700 Angstroms in thickness and typically, a thin liner oxide layer is formed underlying the gate spacers and interposed between the gate spacers and the gate structure and the gate spacers and the substrate. The number of times during a process a semiconductor device is subjected to an hydrofluoric (HF) containing wet etch procedure, can result in severe undercutting of the thin liner oxide layer at a bottom and a top portion thereof. The undercut can result in yield loss due to gate to substrate shorts or leakages.

Figure 1:
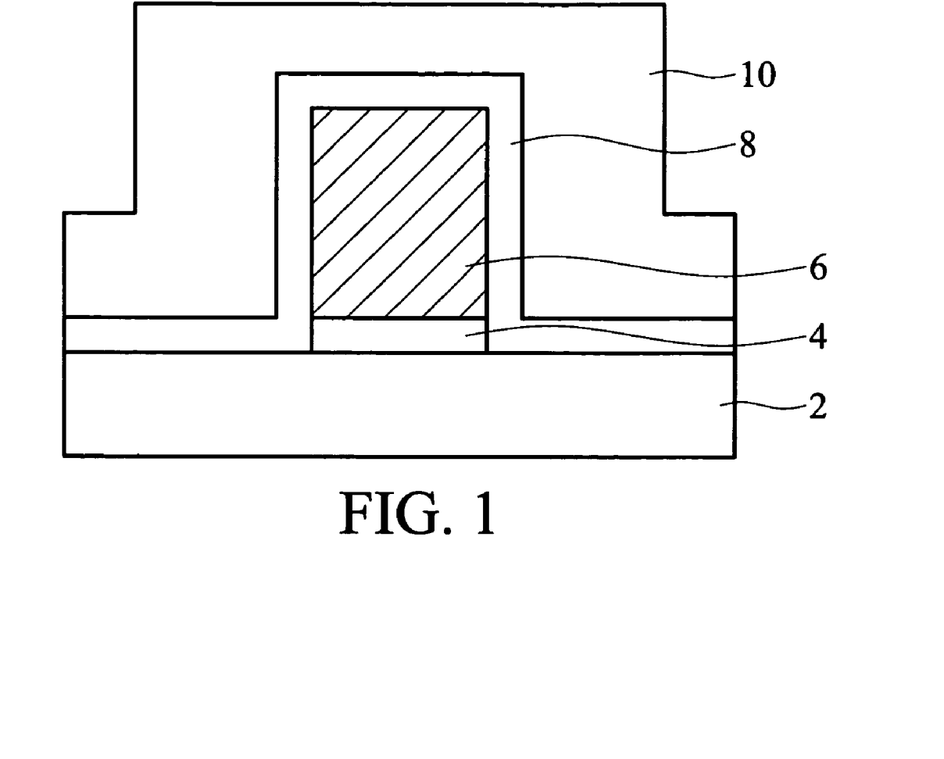
FIGS. 1–3 illustrate the problem of undercut where the occurrence of the undercut is in a layer of liner oxide that is created between a gate spacer and a gate structure.
Figure 2:
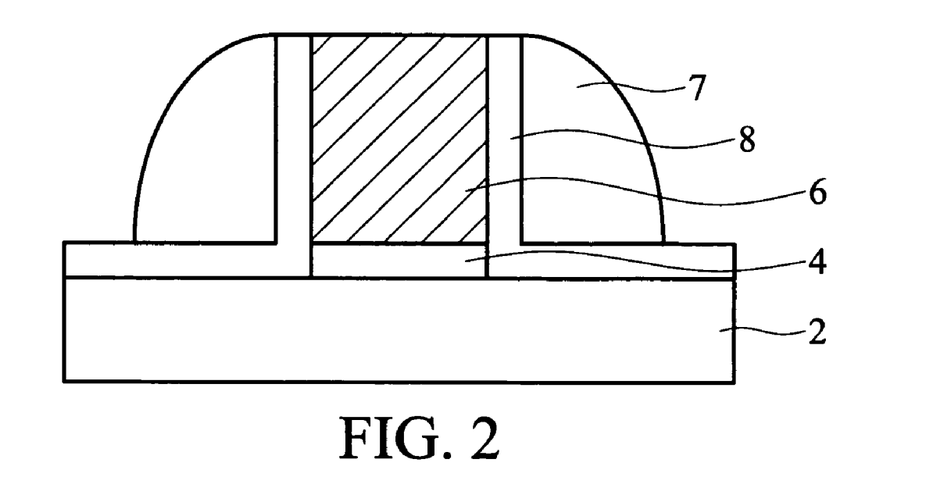
Figure 3:
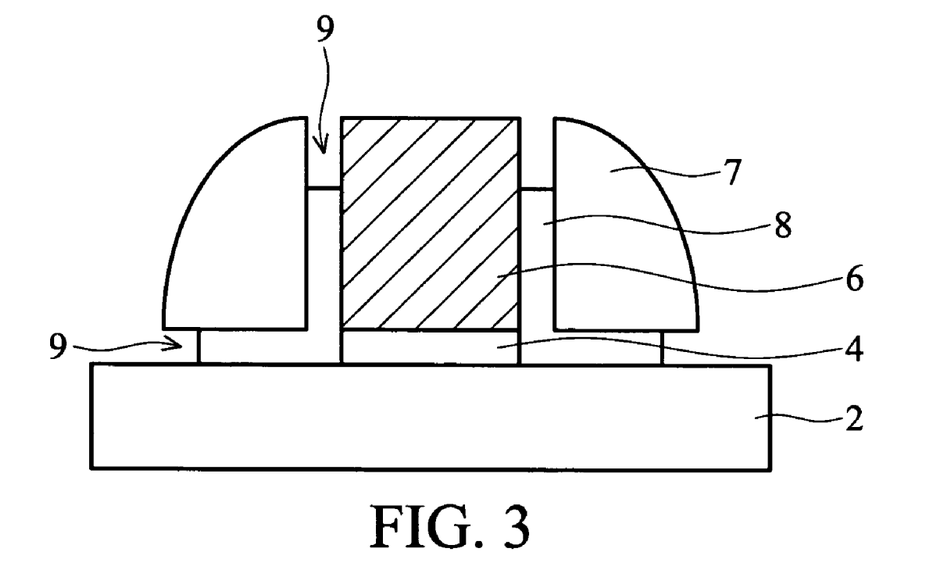

FIGS. 1–3 illustrate the problem of undercut where the occurrence of the undercut is in a layer of liner oxide that is created between a gate spacer and a gate structure. As an example, FIG. 1 shows a cross-sectional view of a partial formation of a conventional CMOS device. The CMOS device created over the surface of a substrate 2 may include: a layer of gate material of the gate structure 6, typically comprising polysilicon; a gate insulator layer 4 formed over the surface of substrate 2; a liner layer 8, deposited over the surface of substrate 2, including the surface of the gate structure 6; and a layer of gate spacer material 10 deposited over the surface of liner layer 8. These structures and the processes for their formation are conventional.

FIG. 2 is a view of the structure of FIG. 1 after the layer of gate spacer material 10 has been etched, stopping on liner layer 8. Also shown are gate spacers 7 created on the sidewalls of the gate structure 6. After the spacers 7 have been created, the liner layer 8 will need to be removed from the surface of substrate 2 where the surface of liner layer 8 is exposed. This process of removal may be performed by etching liner layer 8 using a wet etch procedure comprising an HF solution.

The results of this etch are shown in cross section in FIG. 3. Specifically highlighted in the cross section of FIG. 3 are undercut regions 9 which are the regions where the etched layer of liner layer 8 is attacked by the etch to the point where the etch proceeds underneath the gate spacers 7, resulting in loss of liner layer 8 in the interface between the gate spacers 7 and the gate structure 6 and in the interface between the gate spacers 7 and the substrate 2. Due to the loss of liner layer 8 in these undercut regions 9, device isolation and device performance are negatively affected.

Accordingly, what is needed in the art is a method of manufacture thereof that addresses the above-discussed issues.

SUMMARY

The present invention is directed to the formation of gate spacers on the sides of a gate structure on a semiconductor substrate. In one embodiment, a gate structure is formed on a gate insulator layer of the semiconductor substrate. A liner layer is formed over the exposed surfaces of the substrate, the gate insulator layer, and the gate structure. A layer of gate spacer material is formed over the liner layer. Thereafter, gate spacers are formed from the layer of gate spacer material. Portions of the liner layer on the sidewalls and top of the gate structure are removed. A protection layer is formed over portions of the liner layer, gate structure, and the gate spacers. The protection layer is etched back. A first wet etch procedure is performed to remove exposed portions of the liner layer. The protection layer is removed and a second wet etch procedure is performed to remove a bottom portion and a top portion of the liner layer.

In another embodiment, a gate structure is formed on a gate insulator layer of the semiconductor substrate. A liner layer is formed over the exposed surfaces of the substrate, the gate insulator layer, and the gate structure. A layer of gate spacer material is formed over the liner layer. Thereafter, gate spacers are formed from the layer of gate spacer material. A protection layer is formed over portions of the liner layer, gate structure, and the gate spacers. A descum procedure is performed to expose top portions of the liner layer, gate structure, and the gate spacers. A first wet etch procedure is performed to remove exposed portions of the liner layer. The protection layer is removed and a second wet etch procedure is performed to remove substantially a top portion and a bottom portion of the liner layer.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference will now be made in detail to the present preferred embodiments of the present invention, examples of which are illustrated in the accompanying drawings. The embodiments are applicable for N channel and P channel MOSFET devices as well as for CMOS devices. A method for forming spacers on the sides of a gate structure for controlling spacer oxide loss while reducing spacer oxide undercut will now be described in detail.

Figure 4:
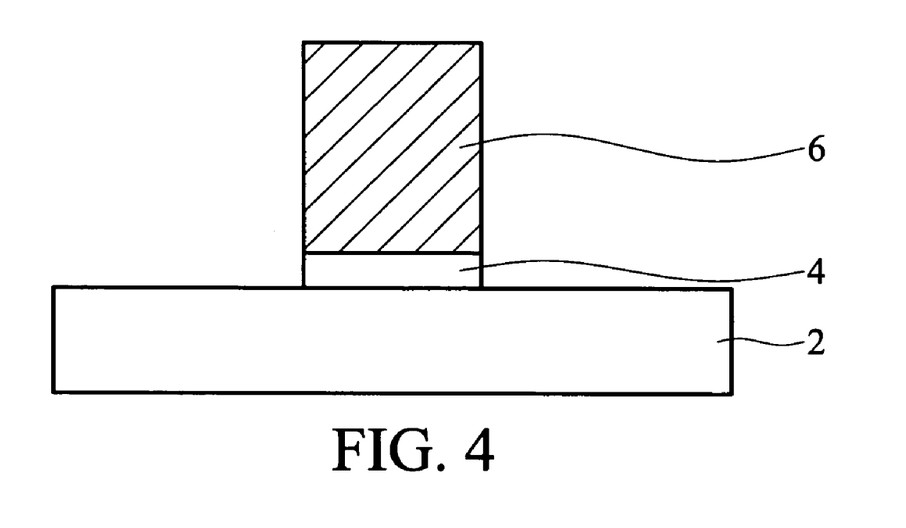
FIG. 4 is a cross-sectional view of a formation of a gate structure on a gate insulator in the fabrication of spacers on the sides of a gate structure according to one embodiment of the present invention.

FIG. 4 is a cross-sectional view of a formation of a gate structure on a gate insulator in the fabrication of spacers on the sides of a gate structure according to one embodiment of the present invention. Gate insulator layer 4, comprising silicon dioxide, may be formed on a semiconductor substrate 2 through a conventional thermal oxidation method. In one embodiment, gate insulator layer 4 is thermally grown in an oxygen-steam ambient for a time period of about 10 to 20 minutes at a temperature of about 900 degrees Celsius to a thickness of between about 20 to 150 Angstroms. For the creation of the gate structure 6, gate structure 6 may be comprised of polysilicon or polycide (metal silicide polysilicon). In one embodiment, a layer of polysilicon is deposited over the gate insulator layer 4 and etched using photolithography followed by anisotropic poly etch. The etch to form the body of the gate structure 6 removes the layer of polysilicon and the gate insulator layer 4 from above the surface of substrate 2 in accordance with the pattern of gate structure 6. After the layers of gate structure 6 and gate insulator layer 4 have been patterned and etched, a self-aligned LDD implantation (not shown) is performed into the surface of substrate 2.

Figure 5:
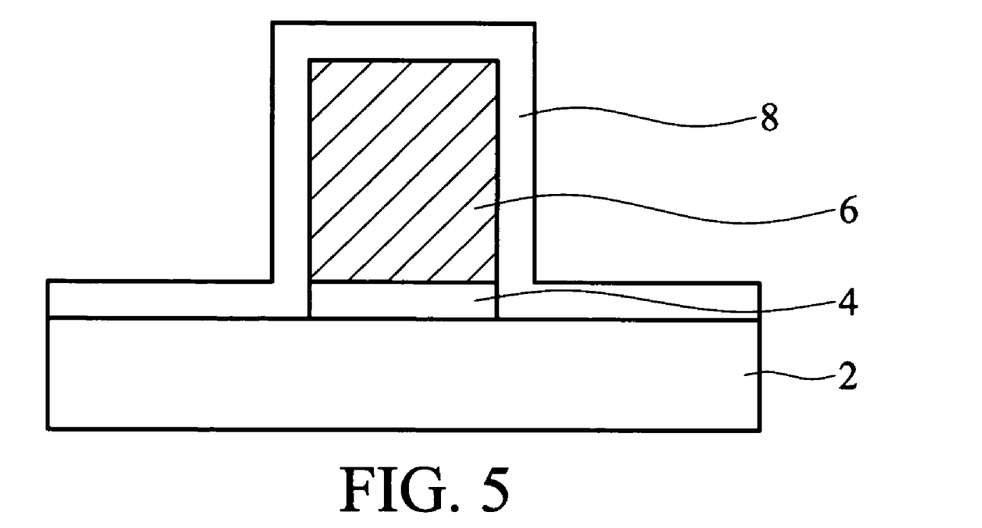
FIG. 5 is a view of the structure of FIG. 4 showing a further step of forming a liner layer according to one embodiment of the present invention.
Figure 6:
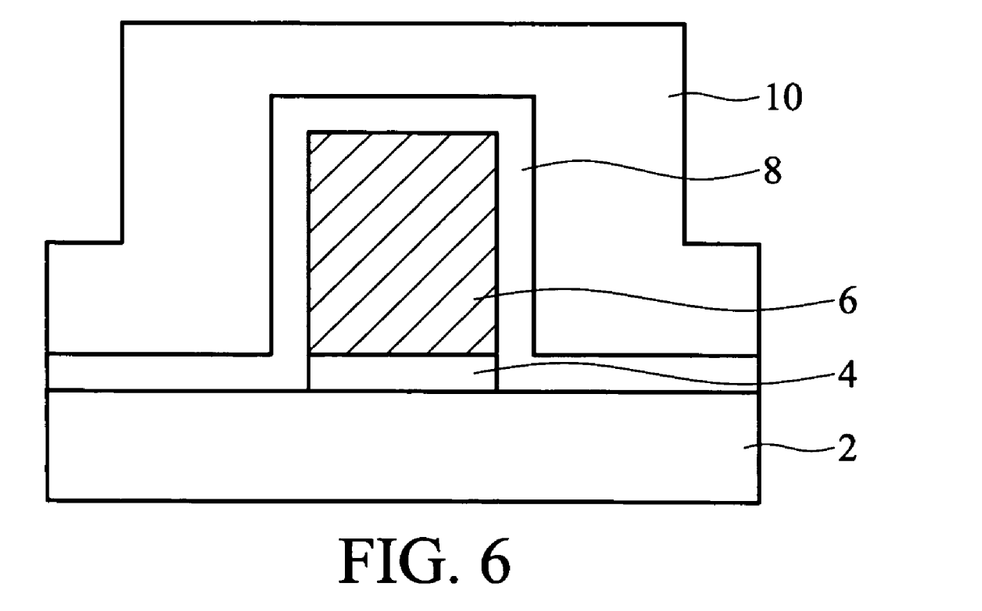
FIG. 6 is a view of the structure of FIG. 5 showing a further step of forming a layer of gate spacer material over the liner layer according to one embodiment of the present invention.

FIG. 5 is a view of the structure of FIG. 4 showing a further step of forming a liner layer according to one embodiment of the present invention. The initial step in the formation of the desired spacer starts with the deposition of liner layer 8 over the exposed surfaces of the substrate 2, gate insulator layer 4, and gate structure 6. Liner layer 8 comprising silicon oxide is formed to a thickness of between about 50 and 300 Angstroms, via LPCVD or via plasma enhanced chemical vapor deposition (PECVD) procedures, for instance. Since liner layer 8 will subsequently be the underlying layer of the spacers, after definition of the spacers, the edge of liner layer 8 will be exposed to a series of wet clean procedures. The wet clean procedures used to remove other silicon oxide layers, or to prepare a semiconductor surface for implant or metal deposition, are performed using HF containing solutions. The removal rate of liner layer 8, in 100:1 dilute hydrofluoric acid (100:1 DHF) is between about 165 to 185 Angstroms/minute. This high removal rate of liner layer 8, in addition to the numerous exposures to the 100:1 DHF solution, may result in a severe loss of liner layer 8, resulting in a severe undercut of the final spacer structure FIG. 6 is a view of the structure of FIG. 5 showing a further step of forming a layer of gate spacer material over the liner layer according to one embodiment of the present invention. Gate spacer material layer 10 may be comprised of silicon nitride ($Si_3N_4$) or silicon oxynitride (SiON). In one embodiment of the present invention, a layer of silicon nitride as the gate spacer material is deposited over the surface of the liner layer 8 and may be deposited using LPCVD or PECVD procedures at a pressure of between about 300 mTorr and 400 mTorr, at a temperature of between about 400 and 1,000 degrees Celsius, to a thickness of between about 400 and 1,000 Angstroms using NH3 and SiH4. The silicon nitride layer may also be deposited using LPCVD or PECVD procedures using a reactant gas mixture such as dichlorosilane (SiCl2H2) and ammonia (NH3) according to one embodiment. In another embodiment, gate spacer material may comprise a composite layer of nitride and oxide to form a composite ONO spacer (not shown in FIG. 6). In one embodiment, the formation of a composite ONO spacer begins with the deposition of a layer of silicon nitride followed by an overlying layer of silicon oxide. Silicon nitride layer may be deposited via LPCVD or PECVD procedures, at a thickness of between about 200 to 700 Angstroms, while overlying silicon oxide layer is obtained via LPCVD or PECVD procedures, at a thickness of between about 500 to 1100 Angstroms, using TEOS as a source.

Figure 7:
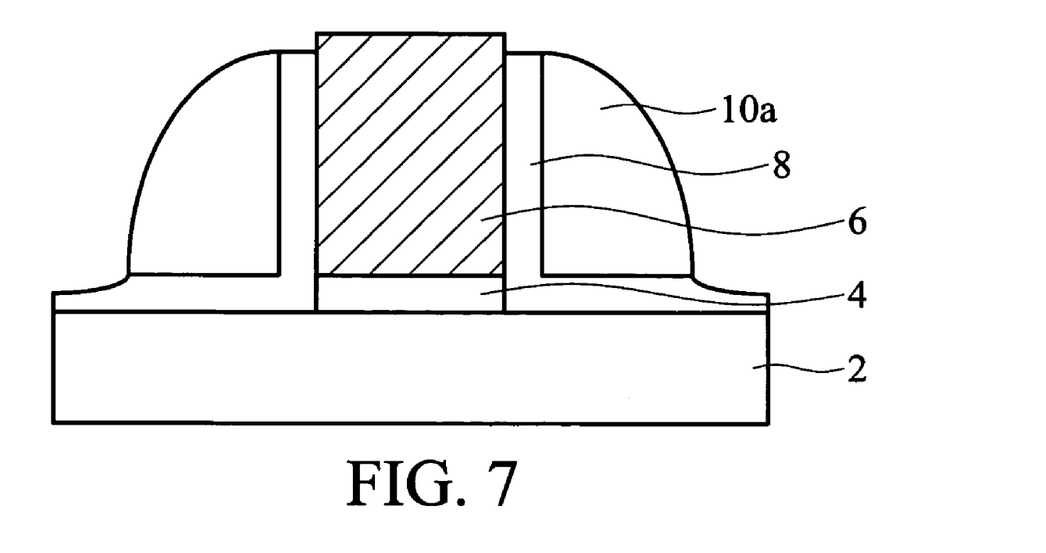
FIG. 7 is a view of the structure of FIG. 6 showing a further step of forming gate spacers from the layer of gate spacer material according to one embodiment of the present invention.
Figure 8:
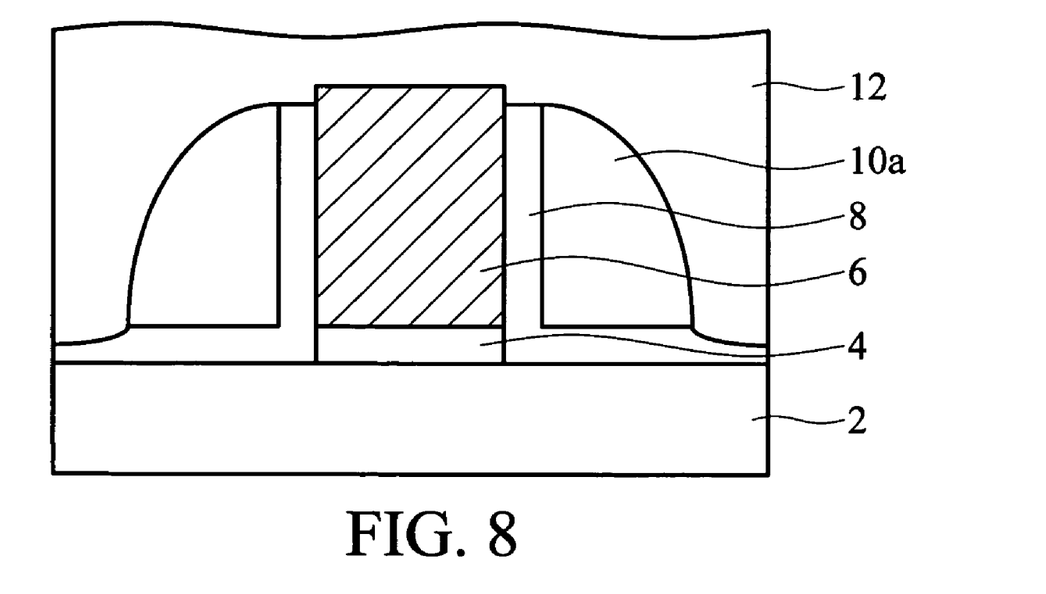
FIG. 8 is a view of the structure of FIG. 7 showing a further step of forming a protection layer over portions of the liner layer, gate structure, and the gate spacers according to one embodiment of the present invention.

FIG. 7 is a view of the structure of FIG. 6 showing a further step of forming gate spacers from the layer of gate spacer material after the layer of gate spacer material has been etched according to one embodiment of the present invention. Shown in FIG. 7 are spacers 10a comprising silicon nitride in one embodiment and comprising a composite layer of nitride and oxide in another embodiment (not shown) created on the sidewalls of gate structure 6. The method of the invention for the etch of the layer of gate spacer material 10 of silicon nitride is a dry etch such as applying an RIE etch using $CHF_3$ or $SF_6$—$O_2$ as an etchant. FIG. 8 is a view of the structure of FIG. 7 after a step of further etching portions of the liner layer on the sidewalls and top of the gate structure.

Figure 9:
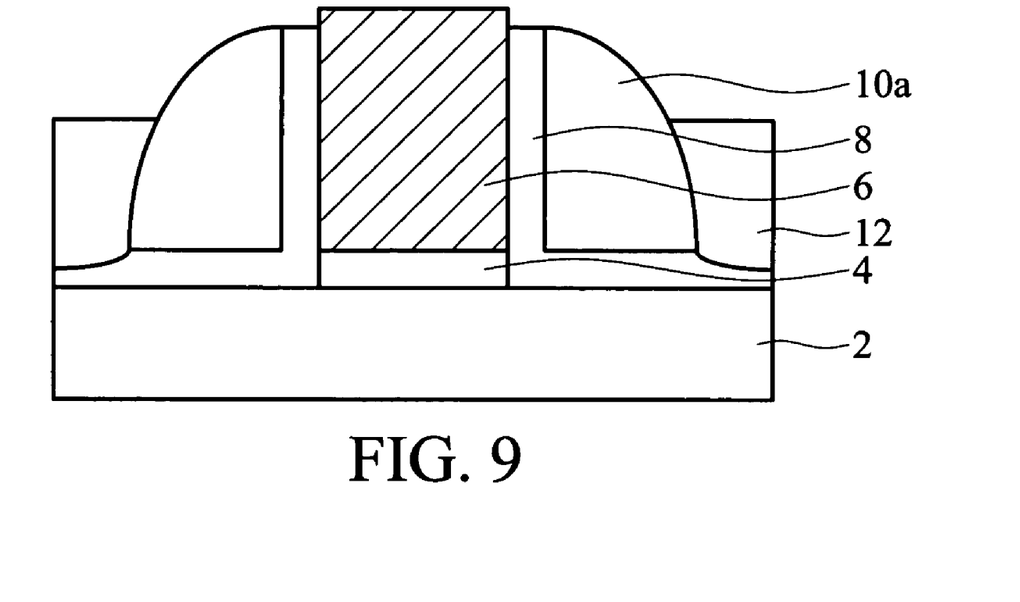
FIG. 9 is a view of the structure of FIG. 8 showing a further step of etching back the protection layer according to one embodiment of the present invention.

FIG. 9 is a view of the structure of FIG. 8 showing a further step of forming a protection layer over portions of the liner layer, gate structure, and the gate spacers according to one embodiment of the present invention. The protection layer 12 may comprise a photoresist material and may be formed over portions of the liner layer 8, gate structure 6, and the gate spacers 10a by a spin coating method, for example according to one embodiment of the present invention. The thickness of protection layer 12 is dependent on the thickness of gate structure 6. Protection layer 12 may be formed of photoresist materials as are conventional in the art of semiconductor fabrication, such as photoresist materials being selected from the general groups of photoresist materials including but not limited to positive photoresist materials and negative photoresist materials. According to another embodiment, the protection layer 12 comprises a bottom anti-reflective coating (BARC) layer. Where protection layer 12 comprises a photoresist material, protection layer 12 is subsequently etched back by employing a dry etch or dry ashing process, for example, to obtain the structure shown in FIG. 10 according to one embodiment of the invention. Where the protection layer 12 comprises a BARC material, a conventional descum procedure may be performed to expose top portions of the liner layer 8, gate structure 6, and the gate spacers 10a and may include oxygen dry ashing.

Figure 10:
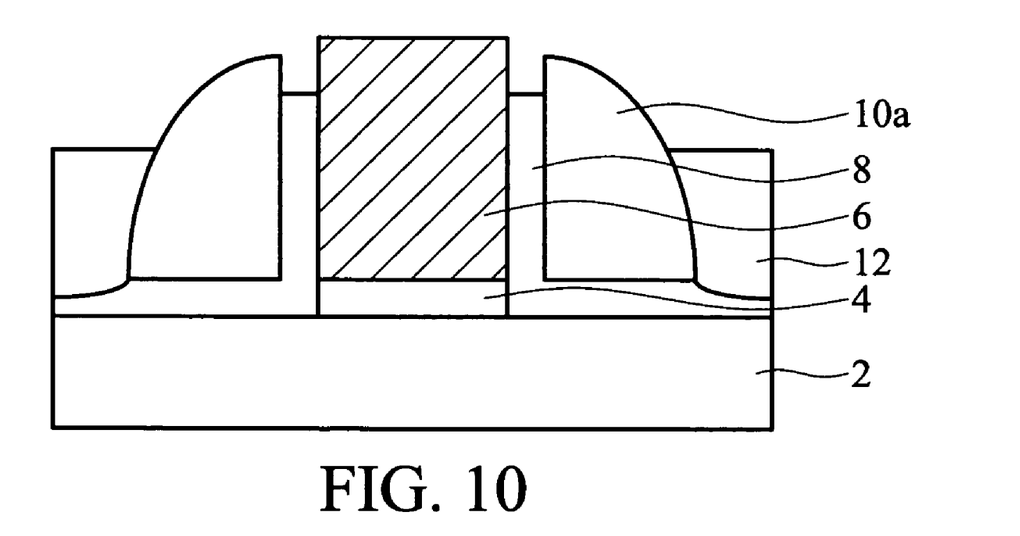
FIG. 10 is a view of the structure of FIG. 9 showing a further step of performing a first wet etch procedure to remove exposed portions of the liner layer according to one embodiment of the present invention.
Figure 11:
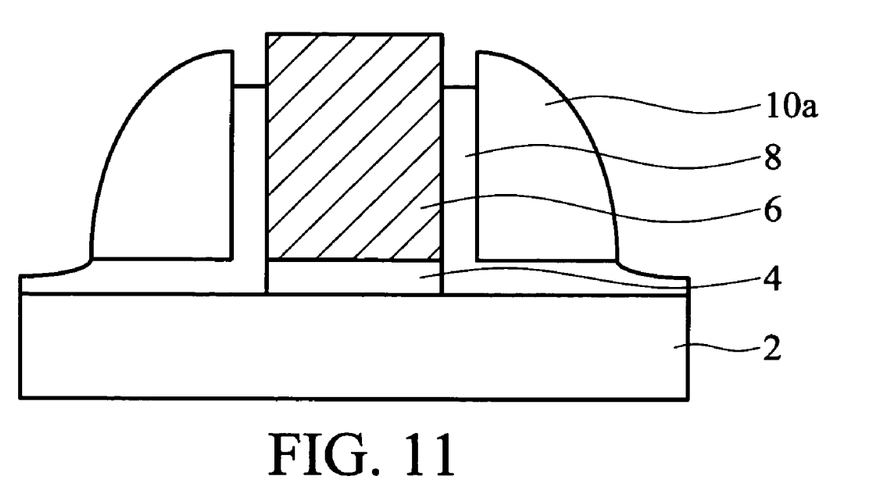
FIG. 11 is a view of the structure of FIG. 10 showing a further step of removing the protection layer according to one embodiment of the present invention.
Figure 12:
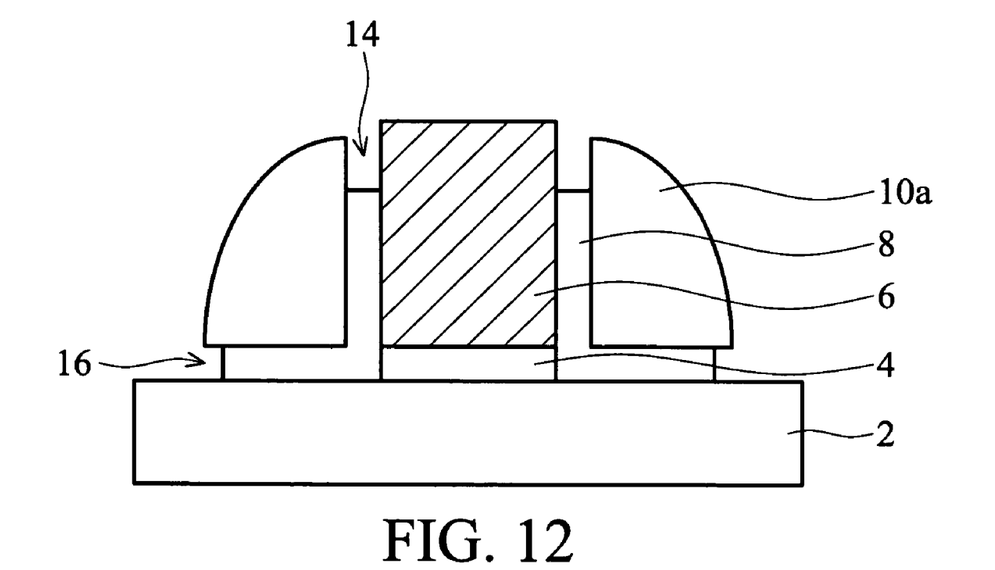
FIG. 12 is a view of the structure of FIG. 11 showing a further step of performing a second wet etch procedure to remove substantially a top portion and a bottom portion of the liner layer according to one embodiment of the present invention.

FIG. 11 is a view of the structure of FIG. 10 showing a further step of performing a first wet etch procedure to remove exposed portions of the liner layer according to one embodiment of the present invention. The first wet etch procedure controls the liner layer 8 loss at a top portion of the interface between the gate spacers and the gate structure and further allows for the formation of silicide on the top and substantially on the sides of gate structure 56 in a later step. After gate spacers 10a have been created as shown in FIG. 11, the structure is subjected to a wet etch procedure which may comprise using a HF solution. The HF solution attacks a top portion of liner layer 8 whereas the lower portions of liner layer 8 are protected from the HF solution by protection layer 12. FIG. 12 shows the structure of FIG. 11 following the removal of protection layer 12 by conventional stripping procedures.

FIG. 13 is a view of the structure of FIG. 12 showing a further step of performing a second wet etch procedure to remove a bottom portion and a top portion of the liner layer according to one embodiment of the present invention. After gate spacers 10a have been created, liner layer 8 is removed from the surface of substrate 2 where the surface of liner layer 8 is exposed. Again, a wet etch process using an HF solution, for example, may be used to etch liner layer 8. The results of this latter etch are shown in FIG. 13. Specifically highlighted in FIG. 13 are undercut regions 14 and 16 which are the regions where the etched liner layer 8 is attacked by the etch to the point where the etch proceeds underneath the gate spacers 10a, resulting in loss of liner layer 8 in the interface between the gate spacers 10a and the gate structure 6 and in the interface between the gate spacers 10a and the substrate 2. Due to the loss of liner layer 8 in these regions 14 and 16, device isolation and device performance is negatively affected. However, with protection layer 12 acting as a protective layer protecting liner layer 8 from a wet etch procedure, undercut region 4, at this point of the process flow, would not have extended as much under gate spacer 10a as in the prior art methods. Further, the loss of liner layer 8 in bottom portion 16 is significantly less than the loss in top portion 14. According to one embodiment of the present invention, the loss of liner layer 8 in top portion 14 compared to the loss of liner layer 8 in bottom portion 16 has a thickness of more than and equal to 50 Angstroms.

The structure of FIG. 13 is now ready for the creation of salicided contact surfaces over the gate structure 6. According to one embodiment, a metal layer, such as cobalt, nickel, titanium, tantalum or tungsten may be deposited via plasma vapor deposition procedures, at a thickness of between about 50 to 100 Angstroms. An anneal procedure, such as an RTA procedure, may then be performed at a temperature of between about 450 to 550 degrees Celsius, for a time between about 20 to 60 seconds, forming metal silicide on the top surface of gate structure 6 and on the top surface of doped source/drain regions (not shown). Of importance is the formation of metal silicide layer in undercut region 16. If undercut region 16 were not kept at a minimum as a result of the application of the protection layer 12, the distance of metal silicide on doped source/drain region to gate structure 6 would have been less, possibly resulting in gate to substrate shorts or leakage.

Further processing steps may include the formation of a stress layer such as a CESL (Contact Etching Stop Layer) over the structure of FIG. 13 to function as a protective layer for the structure of FIG. 13.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of forming spacers on the sides of a gate structure, on a semiconductor substrate, comprising:
    forming a gate structure overlying a gate insulator layer on the substrate;
    forming a liner layer over the exposed surfaces of the semiconductor substrate, the gate insulator layer, and the gate structure;
    forming a layer of gate spacer material over the liner layer;
    forming gate spacers from the layer of gate spacer material;
    forming a protection layer over portions of the liner layer, gate structure, and the gate spacers;
    etching back the protection layer;
    performing a first wet etch procedure to remove exposed portions of the liner layer;
    removing the protection layer; and
    performing a second wet etch procedure to remove substantially a top portion and a bottom portion of the liner layer.

2. The method of claim 1, wherein the gate structure comprises polysilicon.

3. The method of claim 1, further comprising forming a stress layer over portions of the substrate, gate structure, liner layer, and the gate spacers.

4. The method of claim 1, wherein the layer of gate spacer material comprises silicon nitride.

5. The method of claim 1, wherein the layer of gate spacer material comprises silicon oxy-nitride.

6. The method of claim 1, wherein the layer of gate spacer material comprise a composite layer of nitride and oxide.

7. The method of claim 1, wherein the protection layer comprises a photoresist material.

8. The method of claim 1, wherein the first wet etch procedure comprises using an HF solution.

9. The method of claim 1, wherein the second wet etch procedure comprises using an HF solution.

10. The method of claim 1, wherein a loss of the top portion to the bottom portion has a thickness of more than and equal to about 50 Angstroms.

11. A method of forming spacers on the sides of a gate structure, on a semiconductor substrate, comprising:
    forming a gate structure overlying a gate insulator layer on the substrate;
    forming a liner layer over the exposed surfaces of the semiconductor substrate, the gate insulator layer, and the gate structure;

forming a layer of gate spacer material over the liner layer;

forming gate spacers from the layer of gate spacer material;

forming a protection layer over portions of the liner layer, gate structure, and the gate spacers;

performing a descum procedure to expose a top part of the liner layer, gate structure, and the gate spacers;

performing a first wet etch procedure to remove exposed portions of the liner layer;

removing the protection layer; and performing a second wet etch procedure to remove substantially a top portion and a bottom portion of the liner layer.

12. The method of claim 11, wherein the gate structure comprises polysilicon.

13. The method of claim 11, further comprising forming a stress layer over portions of the substrate, gate structure, liner layer, and the gate spacers.

14. The method of claim 11, wherein the layer of gate spacer material comprises silicon nitride.

15. The method of claim 11, wherein the layer of gate spacer material comprises silicon oxy-nitride.

16. The method of claim 11, wherein the layer of gate spacer material comprise a composite layer of nitride and oxide.

17. The method of claim 11, wherein the protection layer comprises a BARC (bottom anti-reflective coating) material.

18. The method of claim 11, wherein the first wet etch procedure comprises using an HF solution.

19. The method of claim 11, wherein the second wet etch procedure comprises using an HF solution.

20. The method of claim 11, wherein a loss of the top portion to the bottom portion has a thickness of more than and equal to about 50 Angstroms.

* * * * *